(12) United States Patent
Yoshiuchi et al.

(10) Patent No.: US 9,632,105 B2
(45) Date of Patent: Apr. 25, 2017

(54) ANGULAR VELOCITY SENSOR FOR SUPPRESSING FLUCTUATION OF DETECTION SENSITIVITY

(71) Applicant: Panasonic Corporation, Osaka (JP)

(72) Inventors: Shigehiro Yoshiuchi, Kyoto (JP); Satoshi Ohuchi, Hyogo (JP); Tsuyoshi Fujii, Osaka (JP); Kensaku Yamamoto, Fukui (JP); Hideo Ohkoshi, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 186 days.

(21) Appl. No.: 14/347,867

(22) PCT Filed: Sep. 28, 2012

(86) PCT No.: PCT/JP2012/006219
§ 371 (c)(1),
(2) Date: Mar. 27, 2014

(87) PCT Pub. No.: WO2013/046705
PCT Pub. Date: Apr. 4, 2013

(65) Prior Publication Data
US 2014/0238131 A1    Aug. 28, 2014

(30) Foreign Application Priority Data
Sep. 30, 2011    (JP) .................. 2011-216344

(51) Int. Cl.
*G01P 15/08*    (2006.01)
*G01C 19/5769*    (2012.01)
(Continued)

(52) U.S. Cl.
CPC ........ *G01P 15/0802* (2013.01); *B81B 7/0048* (2013.01); *G01C 19/5769* (2013.01);
(Continued)

(58) Field of Classification Search
CPC ............ G01C 19/5769; G01P 15/0802; B81B 7/0048; B81B 2201/025; H01L 24/32;
(Continued)

(56) References Cited

U.S. PATENT DOCUMENTS 6,084,299 A * 7/2000 Questad .............. H01L 23/3121
257/706
6,291,274 B1 * 9/2001 Oida ..................... H01L 21/565
257/E21.504
(Continued)

FOREIGN PATENT DOCUMENTS

JP    2003028644 A *    1/2003
JP    2003-270264 A    9/2003
(Continued)

OTHER PUBLICATIONS

Servais et al, Wire Bonding—A Closer Look, 1991.*
International Search Report for Application No. PCT/JP2012/006219 dated Oct. 23, 2012.

*Primary Examiner* — Harshad R Patel
*Assistant Examiner* — David L Singer
(74) *Attorney, Agent, or Firm* — Pearne & Gordon, LLP

(57) ABSTRACT

An inertial force sensor that can suppress fluctuation of detection sensitivity even if an external stress is applied to the inertial force sensor. Angular velocity sensor (1), that is, an inertial force sensor includes ceramic substrate (6), lower lid (4) adhering to ceramic substrate (6) with adhesives (11*a* and 11*b*) (first adhesives), and sensor element (2) adhering to lower lid (4) with adhesives (10*a* and 10*b*) (second adhesives). The elastic moduli of adhesives (11*a* and 11*b*) are smaller than those of adhesives (10*a* and 10*b*).

12 Claims, 13 Drawing Sheets

(51) Int. Cl.
  *B81B 7/00* (2006.01)
  *H01L 23/00* (2006.01)
(52) U.S. Cl.
  CPC ........ *H01L 24/32* (2013.01); *B81B 2201/025* (2013.01); *H01L 2224/48091* (2013.01); *H01L 2224/73265* (2013.01)
(58) Field of Classification Search
  CPC . H01L 2224/73265; H01L 2224/48091; H01L 2224/00014; H01L 2924/0014
  USPC .............. 73/514.16, 514.36, 514.38, 514.02, 73/504.01, 504.02
  See application file for complete search history.

(56) References Cited

U.S. PATENT DOCUMENTS

| | | | | |
|---|---|---|---|---|
| 6,316,840 | B1* | 11/2001 | Otani | B81C 1/0023 257/417 |
| 6,448,624 | B1* | 9/2002 | Ishio | G01P 1/006 257/414 |
| 6,658,937 | B2* | 12/2003 | Ao | G01C 19/5719 73/504.12 |
| 7,485,496 | B2* | 2/2009 | Chien | H01L 21/4871 257/707 |
| 2002/0145207 | A1* | 10/2002 | Anderson | H01L 21/4853 257/787 |
| 2003/0167850 | A1* | 9/2003 | Ishiguro | G01C 9/06 73/718 |
| 2003/0177831 | A1 | 9/2003 | Ikezawa et al. | |
| 2004/0173913 | A1* | 9/2004 | Ohta | B81C 1/00238 257/777 |
| 2004/0188782 | A1* | 9/2004 | Fujii | B81B 7/0058 257/415 |
| 2006/0000294 | A1* | 1/2006 | Ohta | G01C 19/5719 73/862.08 |
| 2006/0255441 | A1 | 11/2006 | Ohta | |
| 2007/0045787 | A1 | 3/2007 | Ino | |
| 2007/0132045 | A1* | 6/2007 | Tsubaki | B81B 7/0048 257/414 |
| 2008/0017961 | A1* | 1/2008 | Lin | H01L 21/561 257/678 |
| 2008/0066546 | A1* | 3/2008 | Katsumata | G01C 19/5719 73/504.12 |
| 2008/0093740 | A1* | 4/2008 | Sakai | B81C 1/0023 257/737 |
| 2008/0156095 | A1* | 7/2008 | Tsuji | B81B 7/0048 73/504.02 |
| 2009/0282917 | A1* | 11/2009 | Acar | G01C 19/5719 73/514.02 |
| 2010/0043550 | A1 | 2/2010 | Ohta | |

FOREIGN PATENT DOCUMENTS

| | | | |
|---|---|---|---|
| JP | 2006-317321 A | 11/2006 | |
| JP | 2007-033393 A | 2/2007 | |
| JP | 2007-035965 A | 2/2007 | |
| JP | 2009-099822 A | 5/2009 | |
| JP | 2010-008123 A | 1/2010 | |
| WO | WO 2009034682 A1 * | 3/2009 | ............ G01C 19/56 |

* cited by examiner

Case 1

Case 2

Case 3

Case 4

ANGULAR VELOCITY SENSOR FOR SUPPRESSING FLUCTUATION OF DETECTION SENSITIVITY

This application is a U.S. national stage application of the PCT international application number PCT/JP2012/006219.

TECHNICAL FIELD

The present invention relates to an inertial force sensor for detecting an acceleration velocity and an angular velocity, which is used in portable terminals, vehicles, and the like.

BACKGROUND ART

Recently, inertial force sensors such as small angular velocity sensors and acceleration velocity sensors, which are to be mounted on portable terminals such as digital cameras, portable telephones, and portable game machines, or on vehicles, have been popularized. A general configuration of an inertial force sensor includes a sensor element for detecting inertial force and a substrate provided with wiring or the like, which are incorporated into one package. The sensor element includes a weight part attached to a support part via a beam part, and detects magnitude of inertial force by measuring a displacement amount of the weight part by a piezo element provided to the beam part. A configuration in which this sensor element is allowed to adhere to a substrate directly or with a lower lid interposed therebetween by using with an elastic adhesive (see, for example, Patent Literatures 1 and 2).

CITATION LIST

Patent Literature

PTL 1: Japanese Patent Unexamined Publication No. 2007-35965
PTL 2: Japanese Patent Unexamined Publication No. 2009-99822

SUMMARY OF THE INVENTION

However, when an mechanical or a thermal external stress is applied to an inertial force sensor or a user substrate on which an inertial force sensor is mounted, an external stress is transferred to a beam part of a sensor element via the substrate, and thus detection sensitivity of the inertial force sensor fluctuates.

The present invention dissolves the above-mentioned problem, and has an object to provide an inertial force sensor capable of suppressing fluctuation of detection sensitivity even when an external stress is applied to the inertial force sensor.

Means to Solve Problems

In order to achieve the above-mentioned object, an inertial force sensor of the present invention includes a substrate having a center portion that is lower than a peripheral portion; a circuit chip having a first surface connected to the peripheral portion of the substrate by first flip-chip bonding; and a sensor element connected to the first surface of the circuit chip by second flip-chip bonding in an inner side than the peripheral portion of the substrate. Elastic moduli of first connection members used for the first flip-chip bonding are smaller than elastic moduli of second connection members used for the second flip-chip bonding.

Furthermore, an inertial force sensor of the present invention includes a substrate, a lower lid adhering to the substrate with first adhesives; and a sensor element adhering to the lower lid with second adhesives. Elastic moduli of the first adhesives are smaller than elastic moduli of the second adhesives.

With such a configuration, even when an external stress is applied to the inertial force sensor, it is possible to suppress transferring of a stress to the sensor element. Thus, fluctuation of detection sensitivity can be suppressed effectively.

Furthermore, an inertial force sensor of the present invention includes a substrate; a circuit chip mounted on the substrate; a lower lid adhering to the circuit chip with first adhesives; and a sensor element adhering to the lower lid with second adhesives. Elastic moduli of the first adhesives are smaller than elastic moduli of the second adhesives.

With such a configuration, even when an external stress is applied to the inertial force sensor, it is possible to suppress transferring of a stress to the sensor element. Thus, fluctuation of the detection sensitivity can be suppressed effectively.

Furthermore, in an inertial force sensor of the present invention, the sensor element includes a quadrangular frame part having a hollow region in an inner side thereof; and a flexible part connected to the frame part in the hollow region. It is preferable that fixing parts are provided on the two facing sides of the frame part, an electrode pad to be connected to the substrate with a bonding wire is disposed on each of the fixing parts, and the first and second adhesives are disposed in positions corresponding to the fixing parts of the sensor element.

With such a configuration, since the fixing parts provided with the electrode pad is supported by the substrate via the lower lid, when an electrode pad of the sensor element and an electrode pad of the substrate are connected to each other by bonding with a bonding wire, the sensor element can be prevented from being tilted.

Furthermore, in an inertial force sensor of the present invention, the flexible part includes four weights and beam parts for connecting the four weights to the frame part, and the lower lid is provided with through-holes in positions corresponding to the weights. It is preferable that a third adhesive is further disposed on an upper surface and a lower surface of a substantially center portion of the lower lid, and an elastic modulus of the third adhesive is larger than elastic moduli of the first adhesives.

With such a configuration, since the sensor element is strongly supported by the substrate via the lower lid at substantially the center portion, when the electrode pad of the sensor element and the electrode pad of the substrate are connected by bonding with a bonding wire, the sensor element can be prevented from being tilted.

Furthermore, in the inertial force sensor of the present invention, the frame part includes an outer frame part having the fixing parts and an outer beam part connected to the fixing parts, and a quadrangular inner beam part connected to the outer beam part at two connection parts and surrounded by two slits, the flexible part links facing sides of the inner beam part, and includes a center beam part parallel to the outer beam part, four arms connected to the center beam part, and the four weights each connected to a tip end of each of the four arms.

With such a configuration, since fluctuation of a frequency difference between drive vibration resonance frequency and detection vibration resonance frequency of a flat vibrator including four arms and four weights can be reduced, so that the fluctuation of the detection sensitivity can be sufficiently suppressed.

Furthermore, in the inertial force sensor of the present invention, the first adhesives are silicon resin adhesives, and the second and third adhesives are epoxy resin adhesives.

Effect of the Invention

According to the present invention, it is possible to provide an inertial force sensor that can suppress fluctuation of detection sensitivity even when an external stress is applied to the inertial force sensor.

DESCRIPTION OF EMBODIMENTS

Hereinafter, an inertial force sensor of this exemplary embodiment of the present invention is described with an angular velocity sensor taken as an example with reference to drawings.

Exemplary Embodiment

Figure 1:
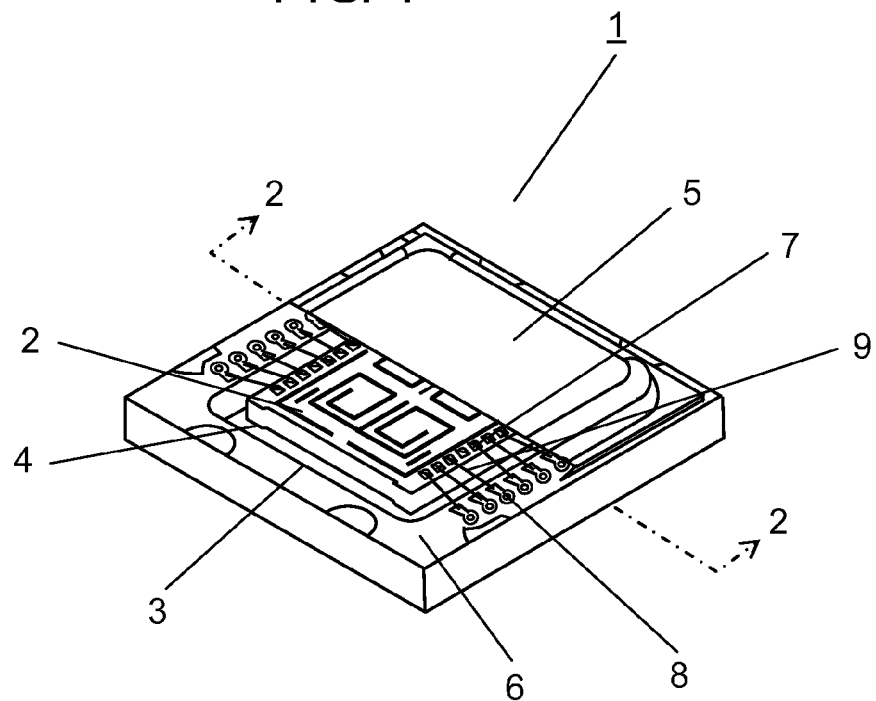
FIG. 1 is an external perspective view of an angular velocity sensor in accordance with an exemplary embodiment of the present invention.
Figure 2:
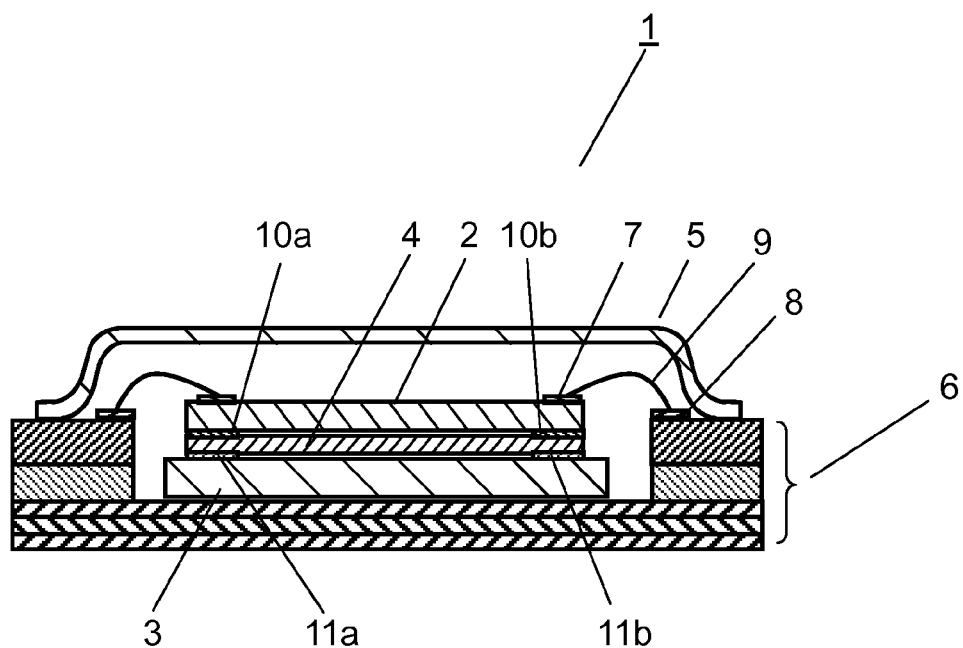
FIG. 2 is a schematic sectional view taken on line 2-2 of FIG. 1.
Figure 3:
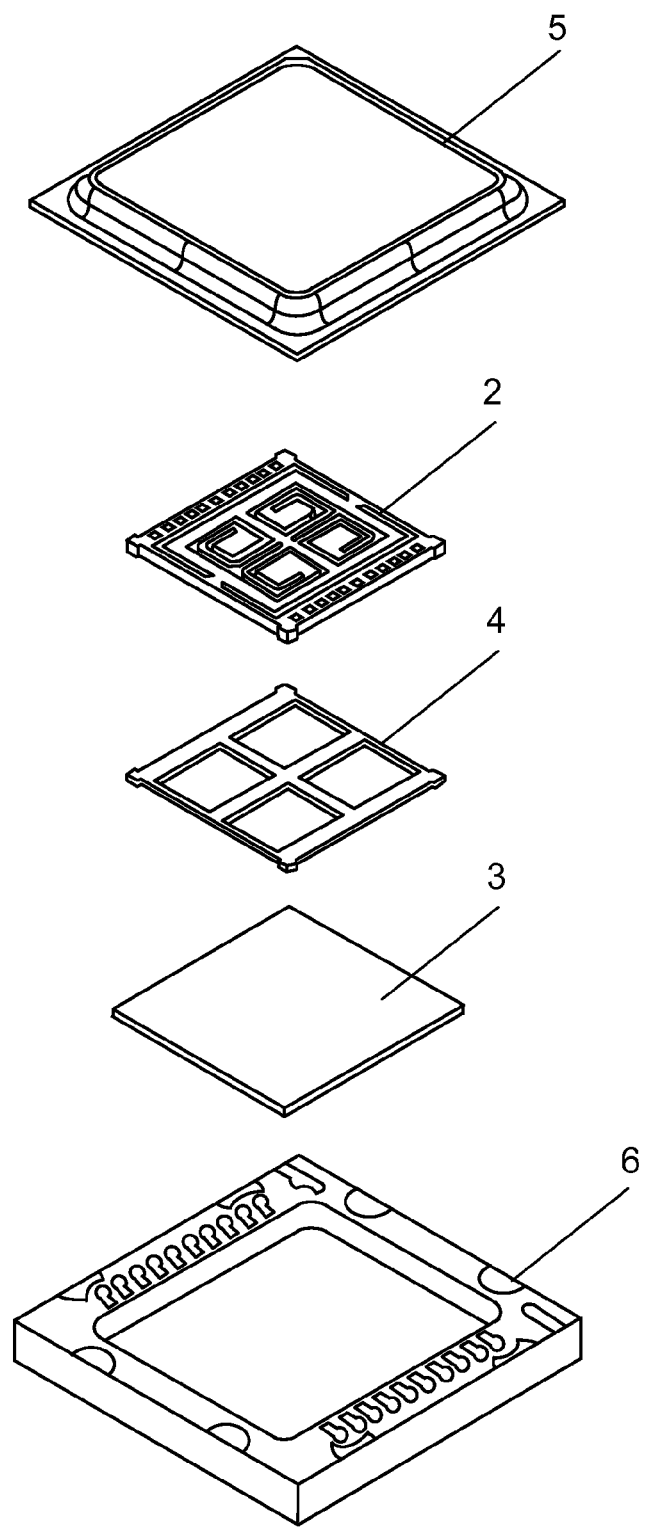
FIG. 3 is an exploded perspective view of the angular velocity sensor in accordance with the exemplary embodiment of the present invention.

FIG. 1 is an external perspective view of an angular velocity sensor in accordance with an exemplary embodiment of the present invention. FIG. 2 is a sectional view taken on line 2-2 of FIG. 1. FIG. 3 is an exploded perspective view of the angular velocity sensor. As shown in FIGS. 1 to 3, angular velocity sensor 1 includes sensor element 2 (in another expression, fourth substrate 2), ASIC 3 (in another expression, second substrate 3), lower lid 4 (in another expression, third substrate 4) disposed between sensor element 2 and ASIC 3, cap 5 disposed on an upper surface of sensor element 2, and ceramic substrate 6 (in another expression, first substrate 6) on which ASIC 3 is to be mounted. Sensor element 2 adheres to an upper surface of lower lid 4 with adhesives 10a and 10b (in other expressions, second adhesives 10a and 10b or second connection layers 10a and 10b). Lower lid 4 adheres to an upper surface of ASIC 3 with adhesives 11a and 11b (in other expressions, first adhesives 11a and 11b or first connection layers 11a and 11b). An electrode pad (not shown) is formed on the lower surface of ASIC 3, and bump-connected to an electrode pad (not shown) corresponding to ceramic substrate 6. Electrode pad 7 is disposed to the outer peripheral part of sensor element 2, and electrode pad 8 is disposed to the position corresponding to electrode pad 7 on outer peripheral part of ceramic substrate 6. Electrode pad 7 and electrode pad 8 are electrically connected to each other with bonding wire 9. Ceramic substrate 6 has a laminated structure including a plurality of wiring layers, and sensor element 2 and ASIC 3 are electrically connected to each other via the wiring layers. Furthermore, an angular velocity detection signal is output from a terminal (not shown) provided on the lower surface of ceramic substrate 6 to an external circuit.

Sensor element 2 has a configuration in which a substantially quadrangular frame part having a hollow region, a beam part connected to the frame part, and a flat vibrator connector to the hollow region via the beam part are formed on the same plane. A drive electrode including a piezoelectric element and a detection electrode are formed on the flat vibrator, and drives the flat vibrator with a predetermined drive vibration frequency. When a predetermined angular velocity is applied in this state, a Coriolis force acts on the flat vibrator, detection vibration having substantially the same frequency as the drive vibration frequency is generated in a direction perpendicular to the drive vibration direction. By detecting a displacement amount in the detection vibration direction of the flat vibrator by the detection electrode, the applied angular velocity is detected. Note here that a small sensor element can be formed by fine processing technology using silicon. A detailed configuration of sensor element 2 is described later.

ASIC 3 is a circuit chip forming a circuit for generating an angular velocity detection signal by using a semiconductor process on a silicon base material. That is to say, ASIC 3 receives a detection signal from sensor element 2 via ceramic substrate 6, carries out necessary signal processes such as a synchronous detection process, a filter process, and a correction process, and then outputs an angular velocity detection signal to the outside via ceramic substrate 6.

Lower lid 4 is inserted between sensor element 2 and ASIC 3, and supports sensor element 2 in the frame part of sensor element 2. Lower lid 4 has a function of protecting sensor element 2 from vibration and shock applied to angular velocity sensor 1, and preventing a mechanical stress or a thermal stress applied from the outside from being transferred to sensor element 2. Detailed configuration of lower lid 4 is described later.

Cap 5 is attached to the upper surface of the outer periphery of ceramic substrate 6, and seals angular velocity sensor 1 and has a function of protecting sensor element 2 from external environment.

Ceramic substrate 6 has a laminated structure including a plurality of wiring layers, and signals are exchanged between sensor element 2 and ASIC 3 via the wiring layers. Furthermore, it functions as a relay substrate with respect to an external circuit (not shown) of angular velocity sensor 1. Furthermore, by fixing ceramic substrate 6 to an apparatus with solder, angular velocity sensor 1 is mounted to the apparatus.

Figure 4:
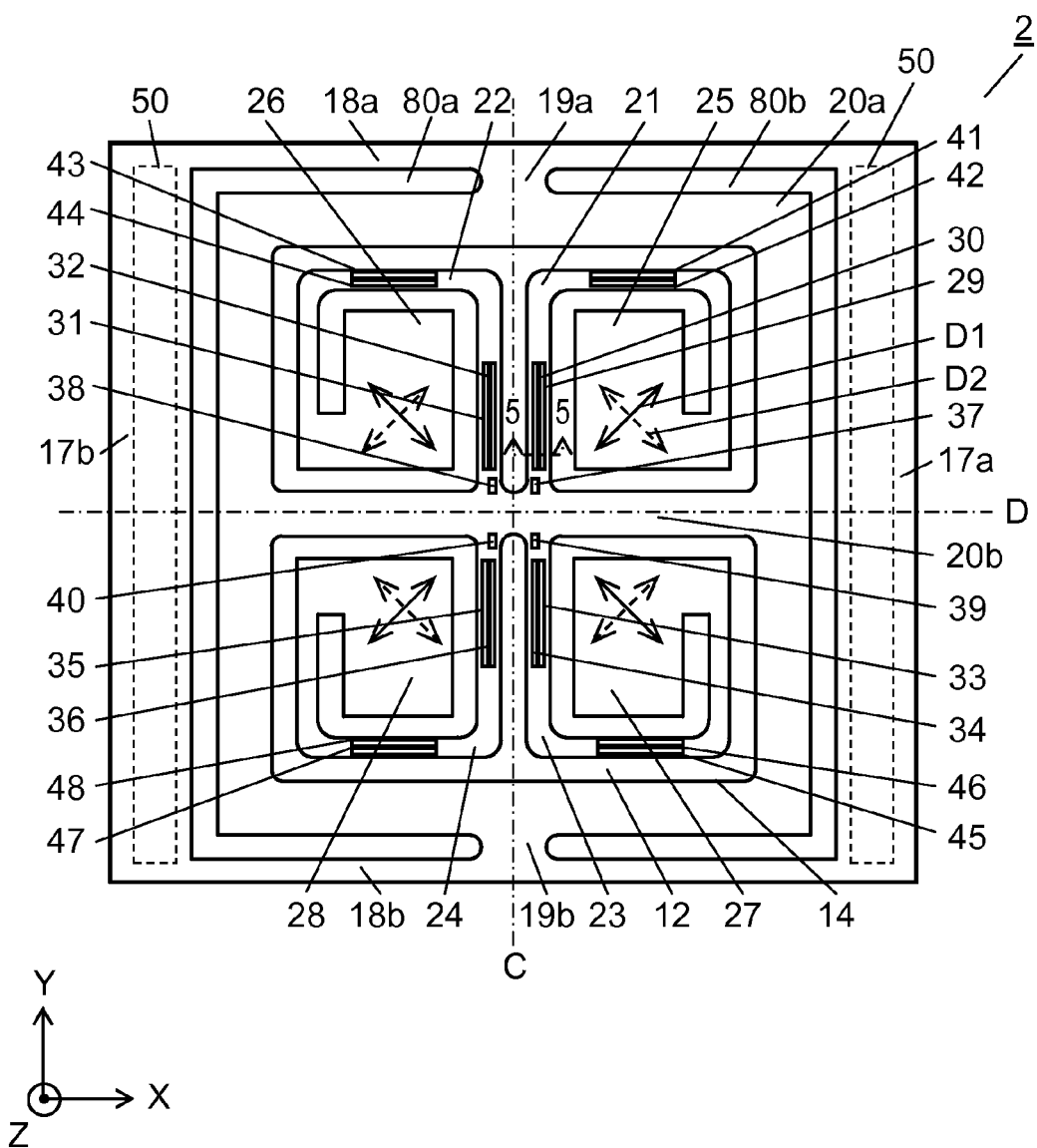
FIG. 4 is a top view showing an example of the angular velocity sensor in accordance with the exemplary embodiment of the present invention.

Next, sensor element 2 is described in detail. FIG. 4 is a top view of a sensor element to be used in the angular velocity sensor in this exemplary embodiment.

Sensor element 2 includes an outer frame part including fixing parts 17a and 17b and outer beam parts 18a and 18b connected to fixing parts 17a and 17b. Furthermore, sensor element 2 includes a sensing part surrounded via first slits 80a and 80b and connection parts 19a and 19b for connecting the outer frame part and the sensing part on the outer frame part. First slits 80a and 80b are formed so as to surround the sensing part excluding connection parts 19a and 19b.

The sensing part includes inner beam part 20a, center beam part 20b, first arm 21, second arm 22, third arm 23, fourth arm 24 (hereinafter, referred to as arms 21 to 24), drive parts 29 to 36, and detector parts 41 to 48. The sensing part further includes weights 25 to 28 provided on end portions of first arm 21, second arm 22, third arm 23, and fourth arm 24, respectively. Arms 21 to 24 and weights 25 to 28 form the flat vibrator.

Inner beam part 20a has a quadrangular shape seen in a top view thereof. Center beam part 20b links the corresponding sides of inner beam part 20a and is formed in parallel to outer beam parts 18a and 18b. Arms 21 to 24 are disposed inside inner beam part 20a, and connected to center beam part 20b.

That is to say, fixing parts 17a and 17b, outer beam parts 18a and 18b, and inner beam part 20a form a frame part having a frame part having inner edge 14 by forming hollow region 12 at the inner side. The above-mentioned lower lid 4 is bonded to bonding parts 50 on the lower surface of fixing parts 17a and 17b. Bonding parts 50 are formed in a prolonged manner along fixing parts 17a and 17b from outer beam part 18a to outer beam part 18b. Center beam part 20b, arms 21 to 24, and weights 25 to 28 are provided in hollow region 12 of the frame part, and form a flexible part connected to inner edge 14. First slits 80a and 80b surrounding inner beam part 20a are through-holes provided between bonding part 50 and the flexible part. Electrode pads (not shown) are formed on the upper surfaces of fixing parts 17a and 17b, respectively. In this way, it is preferable that bonding parts 50 are provided on the lower surfaces of the portions on which the electrode pads of sensor element 2 are formed. Thus, when the electrode pads of sensor element 2 and the electrode pads of ceramic substrate 6 are connected by bonding, sensor element 2 can be prevented from being tilted.

Arm 21 has substantially a J-shape extending out in a Y-axis positive direction from one end connected to center beam part 20b, extending in an X-axis positive direction from a first joint, and extending in a Y-axis negative direction from a second joint. Furthermore, weight 25 is formed on the other end.

Arm 22 has substantially a J-shape extending out in the Y-axis positive direction from one end connected to center beam part 20b, extending in an X-axis negative direction from a first joint, and extending in the Y-axis negative direction from a second joint. Furthermore, weight 26 is formed on the other end. Arm 22 is formed at the same side as arm 21 with respect to center beam part 20b and in line-symmetric with respect to arm 21.

Arm 23 has substantially a J-shape extending out in the Y-axis negative direction from one end connected to center beam part 20b, extending in the X-axis positive direction from a first joint, and extending in the Y-axis positive direction from a second joint. Furthermore, weight 27 is formed on the other end. Arm 23 is formed at the opposite side to arm 21 with respect to center beam part 20b and in line-symmetric with respect to arm 21.

Arm 24 has substantially a J-shape extending out in the Y-axis negative direction from one end connected to center beam part 20b, extending in the X-axis negative direction from a first joint, and extending in the Y-axis positive direction from a second joint. Furthermore, weight 28 is formed on the other end. Arm 24 is formed at the opposite side to arm 23 with respect to center beam part 20b and in line-symmetric with respect to arm 23.

Arms 21 to 24 are connected to weights 25 to 28 on one side of substantially quadrangular weights 25 to 28. Arms 21 to 24 can bend in the X-axis direction, the Y-axis direction and the Z-axis direction.

Drive parts 29 and 30 are provided between center beam part 20b and first joint on arm 21. Detector parts 41 and 42 are provided between the first joint and the second joint on arm 21. Drive parts 31 and 32 and detector parts 43 and 44 are formed on arm 22. Drive parts 33 and 34 and detector parts 45 and 46 are formed on arm 23. Drive parts 35 and 36 and detector parts 47 and 48 are formed on arm 24.

Furthermore, center beam part 20b is provided with monitor parts 37 to 40.

Figure 5:
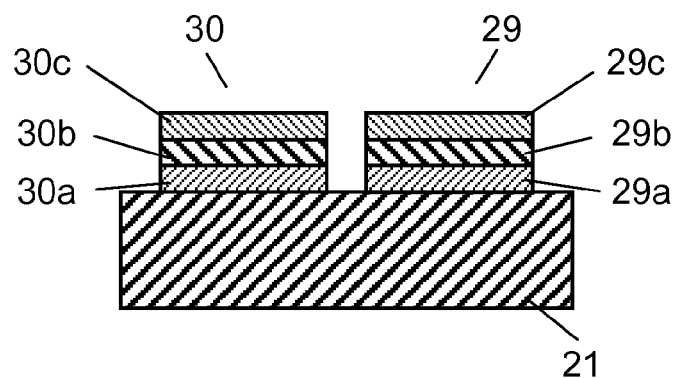
FIG. 5 is a schematic sectional view taken on line 5-5 of FIG. 4.

FIG. 5 is a sectional view showing a schematic configuration of drive parts 29 and 30, and shows a cross section along line 5-5 in FIG. 4. Drive part 29 is formed by sandwiching piezo element 29b between lower electrode 29a and upper electrode 29c, and drive part 30 is formed by sandwiching piezo element 30b between lower electrode 30a and upper electrode 30c. Drive parts 29 and 30 are formed in parallel to each other on the upper surface of arm 21.

Both lower electrodes 29a and 30a are in a reference electric potential, and arm 21 can be vibrated in D1 direction of FIG. 4 by applying alternating driving voltages in the opposite phases to upper electrodes 29c and 30c. Drive parts 31 to 36 are also provided on the upper surface of arms 22 to 24 by the same structure as those of drive parts 29 and 30, respectively.

Detector parts 41 to 48 detect displacement in D2 direction of arms 21 to 24 or displacement in the Z-axis direction. Detector parts 41 to 48 are formed in a piezoelectric method using a piezo element similar to drive parts 29 and 30 shown in FIG. 5.

As mentioned above, since detector parts 41 to 48 are provided in symmetric to axis C parallel to Y-axis and axis D parallel to X-axis, components of the angular velocity and acceleration velocity around the other axes, which are drive signals as unnecessary signals, can be offset each other.

Next, principle of sensor element 2 is described. An AC voltage having a drive vibration resonance frequency is applied from an external drive circuit (not shown) to drive parts 29 and 30, a flat vibrator composed of arm 21 and weight 25 is driven and vibrated along drive vibration direction D1 in an XY plane. At this time, when an angular velocity is applied around a Z axis, a Coriolis force occurs in a direction perpendicular to drive vibration direction D1. The detection vibration that synchronizes the drive vibration is excited in detection vibration direction D2 by the Coriolis force. Distortion of arm 21 generated by the detection vibration is detected by detector parts 41 and 42 as displacement of arm 21, so that the angular velocity can be detected.

Note here that in general, the detection vibration resonance frequency in detection vibration direction D2 is set to the vicinity of the drive vibration resonance frequency in detection vibration direction D1. This is because the detection vibration generated when the angular velocity is applied synchronizes the drive vibration, so that the detection vibration tends to be largely excited when the detection vibration resonance frequency is nearer to the drive vibration resonance frequency.

Note here that one of the parameters for determining the resonance frequency of the flat vibrator composed of arms 21 to 24 and weights 25 to 28 includes spring constants of outer beam parts 18a and 18b, inner beam part 20a and center beam part 20b supporting the flat vibrator. When angular velocity sensor 1 is manufactured, or it is incorporated into the apparatus, when a substrate deforming stress is applied to ceramic substrate 6, ceramic substrate 6 is distorted. The distortion (stress) is propagated to fixing parts 17a and 17b, outer beam parts 18a and 18b, inner beam part 20a, and center beam part 20b of sensor element 2, and the spring constants of the beam parts are changed, and the resonance frequency of the flat vibrator fluctuates. When the resonance frequency of the flat vibrator fluctuates, a difference between the detection vibration resonance frequency and the drive vibration resonance frequency fluctuates, the detection sensitivity of sensor element 2 fluctuates.

Figure 6:
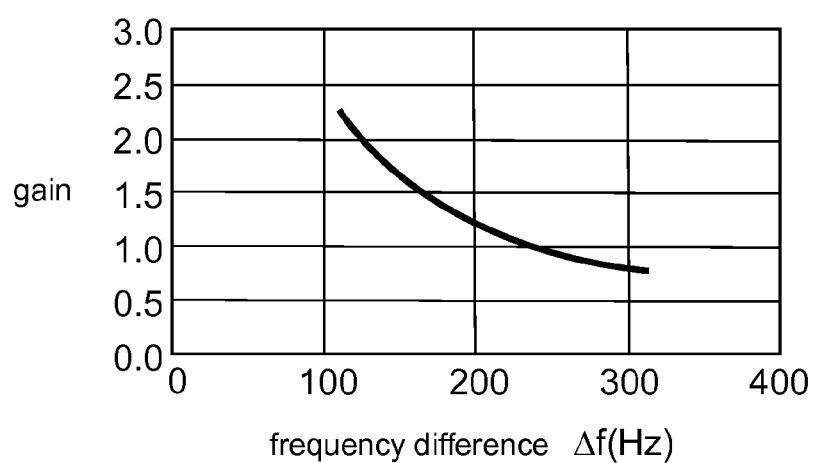
FIG. 6 is a graph showing a relation of a frequency difference between a drive vibration resonance frequency and a detection vibration resonance frequency of a flat vibrator with respect to a gain of the sensor element in the angular velocity sensor in accordance with the exemplary embodiment of the present invention.

FIG. 6 shows relation of frequency difference Δf between the drive vibration resonance frequency and the detection vibration resonance frequency of the flat vibrator with respect to gain (detection sensitivity) of sensor element 2. As shown in FIG. 6, when frequency difference Δf fluctuates from 200 Hz to 300 Hz, the gain fluctuates from 1.2 to 0.7.

Note here that magnitude of the stress transferred from ceramic substrate 6 to sensor element 2 is largely affected by adhesives 10a and 10b for allowing sensor element 2 to adhere to lower lid 4 each other and adhesives 11a and 11b for allowing lower lid 4 and ASIC 3 to adhere to each other.

Furthermore, when an ambient temperature of angular velocity sensor 1 is changed, a thermal stress is applied to sensor element 2 due to a difference in the coefficients of thermal expansion of ceramic substrate 6, lower lid 4, and sensor element 2. Outer beam parts 18a and 18b, inner beam part 20a, and center beam part 20b are also distorted due to the thermal stress, so that sensitivity of the sensor element is changed by fluctuation of the resonance frequency of the flat vibrator. Magnitude of the thermal stress transferred to sensor element 2 is largely affected by adhesives 11a and 11b.

Next, the relation between an element part stress applied to sensor element 2 when a substrate deforming stress or a thermal stress is applied to angular velocity sensor 1, and adhesives 10a and 10b and 11a and 11b is described.

Figure 7:
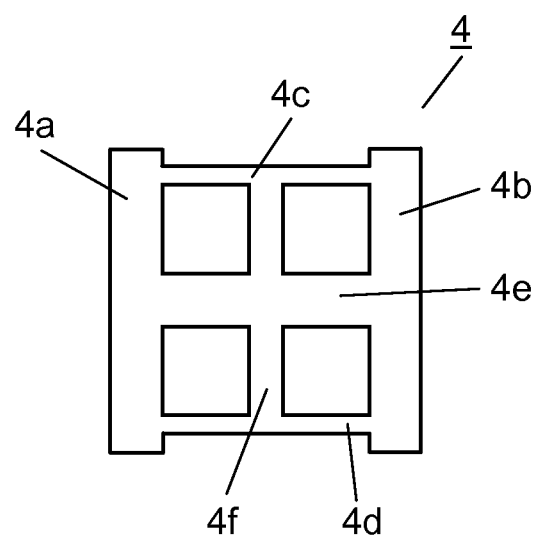
FIG. 7 is a top view of the lower lid of the angular velocity sensor in accordance with the exemplary embodiment of the present invention.

FIG. 7 is a top view of the lower lid used in the angular velocity sensor in this exemplary embodiment. Lower lid 4 supports sensor element 2 from the lower side, fixes it onto ASIC 3, and is made of material such as silicon.

Lower lid 4 includes six support parts 4a, 4b, 4c, 4d, 4e, and 4f. Support parts 4a and 4b correspond to fixing parts 17a and 17b of sensor element 2. Support parts 4c and 4d correspond to outer beam parts 18a and 18b of sensor element 2. Support part 4e corresponds to a portion along the D axis of center beam part 20b of sensor element 2. Support part 4f corresponds to a portion along the C axis of sensor element 2. A part corresponding to weights 25 to 28 of sensor element 2 is a through hole, so that vibration in the Z-axis direction of weights 25 to 28 is not prevented. Adhesives 10a and 10b are coated on surfaces of support parts 4a and 4b which are brought into contact with sensor element 2. Adhesives 11a and 11b are coated on surfaces of support parts 4a and 4b which are brought into contact with ASIC 3.

Next, relation between types of adhesives 11a and 11b and the element part stress transferred to sensor element 2 when the external stress is applied to angular velocity sensor 1 is described.

Figure 8A:
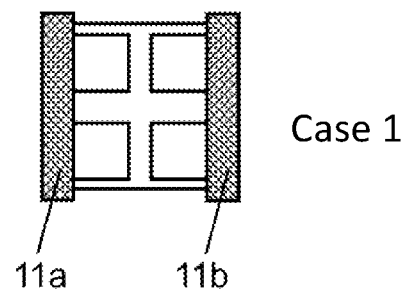
FIG. 8A is a view for illustrating disposition of the adhesives on the lower lid of the angular velocity sensor in accordance with the exemplary embodiment of the present invention.
Figure 8B:
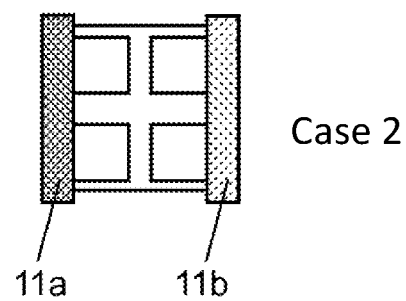
FIG. 8B is a view for illustrating disposition of the adhesives on the lower lid of the angular velocity sensor in accordance with the exemplary embodiment of the present invention.
Figure 8C:
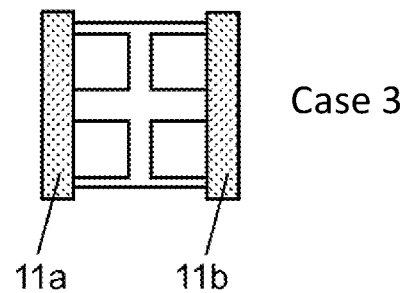
FIG. 8C is a view for illustrating disposition of the adhesives on the lower lid of the angular velocity sensor in accordance with the exemplary embodiment of the present invention.
Figure 8D:
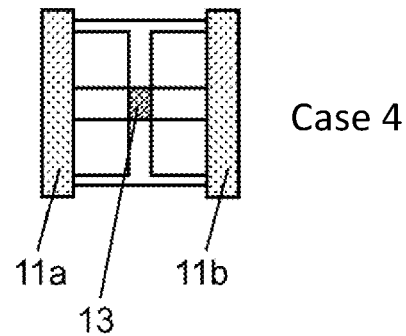
FIG. 8D is a view for illustrating disposition of the adhesives on the lower lid of the angular velocity sensor in accordance with the exemplary embodiment of the present invention.

FIGS. 8A to D are views showing coated positions and the types of adhesives 11 on lower lid 4. FIGS. 8A to D are views showing the lower surface of lower lid 4 (a surface that is brought into contact with ASIC 3). FIG. 8A shows a case (case 1) in which adhesives 11a and 11b are both epoxy resin. FIG. 8B shows a case (case 2) in which adhesive 11a is epoxy resin, and adhesive 11b is silicon resin (for example, silicone rubber). FIG. 8C shows a case (case 3) in which adhesives 11a and 11b are both silicon resin. FIG. 8D shows a case (case 4) in which adhesive 13 (third adhesive) is further added to the upper and lower surfaces of an intersection portion between support part 4e and support part 4f (substantially the center portion of lower lid 4) in addition to FIG. 8C. Note here that adhesives 10a and 10b are epoxy resin in both cases. Herein, an elastic modulus of the epoxy resin is larger than that of silicon resin. The elastic modulus of the epoxy resin is about 6 GPa, and the elastic modulus of silicon resin is about 6 MPa.

Figure 9:
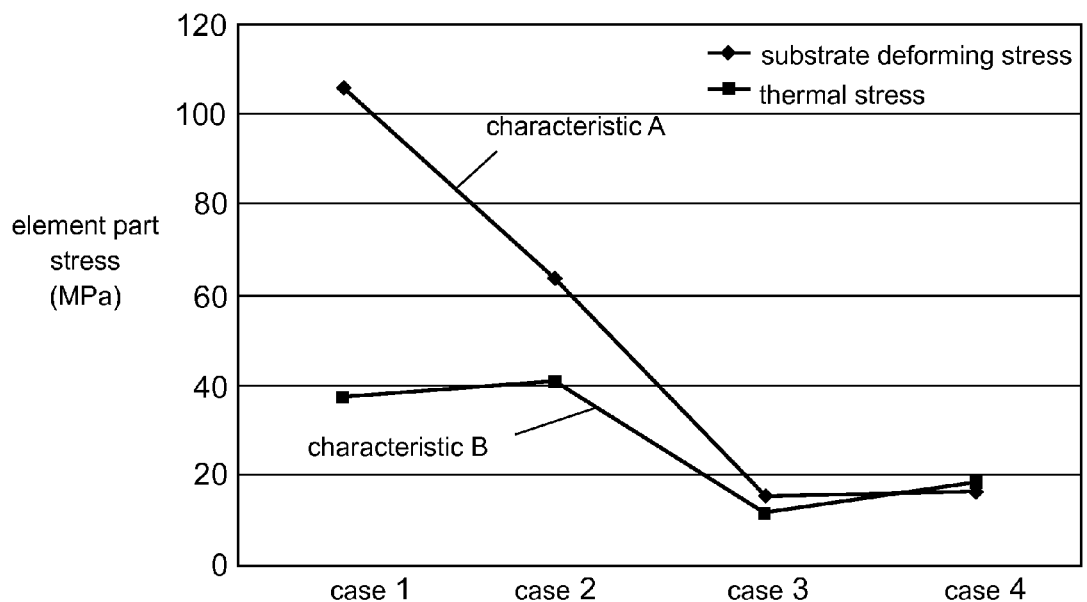
FIG. 9 is a graph showing simulation results of the relation between the adhesive of the lower lid of the angular velocity sensor and an element part stress in accordance with the exemplary embodiment of the present invention.

FIG. 9 is a graph showing a change of the element part stress (unit: MPa) corresponding to each of the cases (cases 1 to 4) of FIGS. 8A to D. Herein, the element part stress of the ordinate shows a stress transferred to sensor element 2 when external stresses such as a substrate deforming stress and a thermal stress are applied to angular velocity sensor 1.

Figure 10:
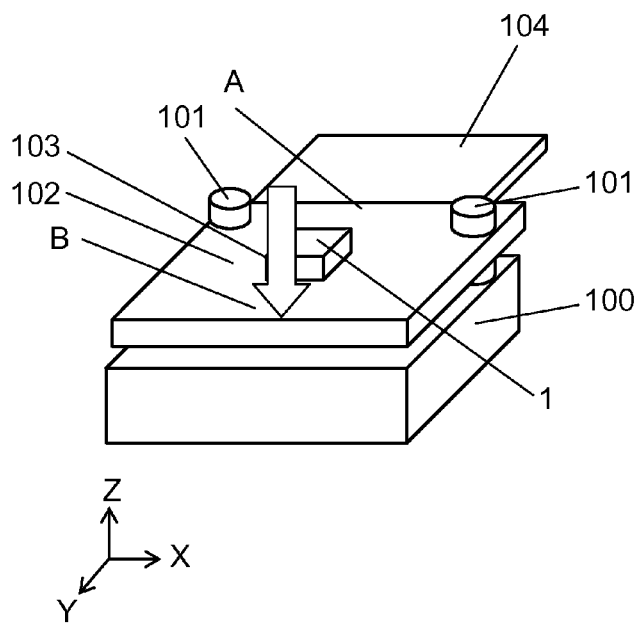
FIG. 10 is a view for illustrating a method for applying a substrate deforming stress to the angular velocity sensor in accordance with the exemplary embodiment of the present invention.

A method for measuring an element part stress (characteristic A) with respect to the substrate deforming stress is shown in FIG. 10. As shown in FIG. 10, base 102 is fixed to bench 100 in a manner in which two points at both ends in the end portion A in the X-axis direction of end portion A at one side of the Y-axis direction. Spacer 104 having a predetermined thickness is inserted between bench 100 and base 102 at end portion A. Angular velocity sensor 1 is mounted in substantially the center portion of the upper surface of base 102, and the lower surface of angular velocity sensor 1 and the upper surface of base 102 adhere to each other with an adhesive. The other end portion B of base 102 is depressed in the direction shown by arrow 103 (Z-axis direction, vertical direction). Thus, end portion B of base 102 can be bent downward by an amount corresponding to the thickness of spacer 104. In this state, end portion B is depressed so as to deform base 102 by only 0.5 mm. In this state, the element part stress transferred to sensor element 2 is measured.

On the other hand, an element part stress (characteristic B) with respect to the thermal stress is a stress which sensor element 2 receives when the ambient temperature of angular velocity sensor 1 is made to be 85° C. with respect to the reference temperature of 25° C.

As shown in characteristic A of FIG. 9, as to the substrate deforming stress, it is demonstrated that element part stresses are changed to 106 MPa, 64 MPa, 15 MPa, and 16.4 MPa, respectively, corresponding to case 1, case 2, case 3, and case 4. Similarly, as shown in characteristic B, as to the thermal stress, it is demonstrated that the element part stresses are changed to 36.9 MPa, 40.6 MPa, 11.7 MPa, and 18.5 MPa, respectively, corresponding to case 1, case 2, case 3, and case 4. In this way, as to the substrate deforming stress, it is demonstrated that the element part stress of case 3 is reduced to about 1/7 as compared with that of case 1. That is to say, when elastic moduli of adhesives 11a and 11b to be coated on the surface that is brought into contact with ASIC 3 of support parts 4a and 4b of lower lid 4 are made to be smaller than that of adhesives 10a and 10b to be coated on the surface those is brought into contact with sensor element 2 of support parts 4a and 4b of lower lid 4, the element part stress can be radially reduced. With respect to the thermal stress, the element part stress of case 3 is the smallest.

In this way, it is preferable that adhesives 10a and 10b that are hard (having large elastic moduli) are used for the upper surface (primary adhesive bonding surface) of lower lid 4 that is brought into direct contact with sensor element 2, and adhesives 11a and 11b that are soft (having small elastic moduli) are used for the lower surface (secondary adhesive bonding surface) of lower lid 4 that is not brought into direct contact with sensor element 2. Thus, even when the substrate deforming stress or the thermal stress is applied to angular velocity sensor 1, it is possible to efficiently suppress transmittance of such stresses to sensor element 2. Therefore, it is possible to suppress fluctuation of a frequency difference between the drive vibration resonance frequency and the detection vibration resonance frequency of sensor element 2, and suppress fluctuation of detection sensitivity of the angular velocity. Note here that as the soft adhesives, instead of silicon resin, gel-state adhesives (30 KPa to 300 KPa), silicone rubber (4 MPa to 40 MPa), or the like, may be used. Furthermore, as hard adhesive, instead of epoxy resin, cyanoacrylate adhesive (0.7 GPa to 1 GPa), glass (65 GPa to 90 GPa), or the like, may be used.

By the way, in the case of FIG. 8D (case 4), in addition to support parts 4a and 4b of lower lid 4, adhesive 13 is coated on the upper surface and lower surface of the center portion on which support part 4e and support part 4f cross over each other, and the elastic modulus of adhesive 13 is made to be larger than the elastic moduli of adhesives 11a and 11b. Thus, lower lid 4 can be strongly supported on the upper surface of ASIC 3 with adhesive 13 having a large elastic force. Therefore, also when electrode pad 7 of sensor element 2 and electrode pad 8 of ceramic substrate 6 are connected by bonding with bonding wire 9, it is possible to prevent sensor element 2 from being tilted.

Figure 11:
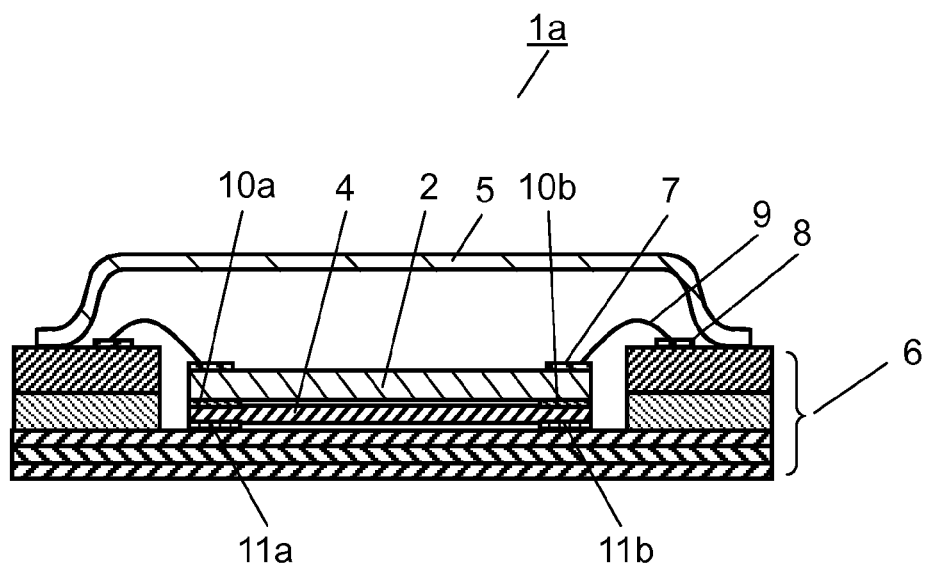
FIG. 11 is a schematic sectional view of another example of the angular velocity sensor in accordance with the exemplary embodiment of the present invention.

Next, another angular velocity sensor of this exemplary embodiment is described. FIG. 11 is a schematic sectional view showing a configuration of another angular velocity sensor 1a of this exemplary embodiment. As shown in FIG. 11, angular velocity sensor 1a is different from angular velocity sensor 1 in that ASIC 3 (not shown) is not incorporated into angular velocity sensor 1a, and lower lid 4 is directly mounted on the upper surface of ceramic substrate 6. Then, ASIC 3 is disposed outside of angular velocity sensor 1a, and sensor element 2 exchanges signals with respect to outside ASIC 3 via ceramic substrate 6. In angular velocity sensor 1a, lower lid 4 and sensor element 2 adhere to each other with adhesives 10a and 10b, and lower lid 4 and ceramic substrate 6 adhere to each other with adhesives 11a and 11b. Also in angular velocity sensor 1a, when the elastic moduli of adhesives 11a and 11b are made to be smaller than those of adhesives 10a and 10b, it is possible to suppress the transmission of a substrate deforming stress and a thermal stress to sensor element 2. As a result, the fluctuation of the frequency difference between the drive vibration resonance frequency and the detection vibration resonance frequency of sensor element 2 can be reduced, and fluctuation of the detection sensitivity can be efficiently suppressed.

Figure 12:
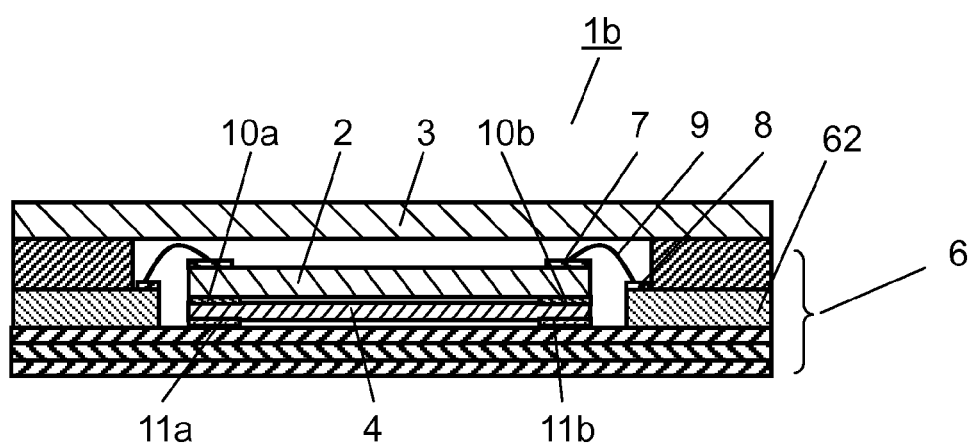
FIG. 12 is a schematic sectional view showing still another example of the angular velocity sensor in accordance with the exemplary embodiment of the present invention.

A still another example of the angular velocity sensor in this exemplary embodiment is described. FIG. 12 is a schematic sectional view showing a configuration of the still another angular velocity sensor 1b of this exemplary embodiment. As shown in FIG. 12, angular velocity sensor 1b is different from angular velocity sensor 1 in that ASIC 3 instead of cap 5 is mounted on the upper surface of ceramic substrate 6, and lower lid 4 is directly mounted on the upper surface of ceramic substrate 6. An electrode pad (not shown) is formed on the lower surface of the outer periphery of ASIC 3, and is bump-connected to the electrode pad (not shown) which corresponds to the uppermost layer of ceramic substrate 6. Furthermore, electrode pad 8 is disposed on the upper surface of the inner periphery of wiring layers 62 of ceramic substrate 6, and is electrically connected to electrode pad 7 of sensor element 2 with bonding wire 9. Also in angular velocity sensor 1b, lower lid 4 and sensor element 2 adhere to each other with adhesives 10a and 10b, and lower lid 4 and ceramic substrate 6 adhere to each other with adhesives 11a and 11b. Also in angular velocity sensor 1b, when the elastic moduli of adhesives 11a and 11b can be made to be smaller than the elastic moduli of adhesives 10a and 10b, it is possible to suppress the transmission of a substrate deforming stress and a thermal stress to sensor element 2. As a result, the fluctuation of the frequency difference between the drive vibration resonance frequency and the detection vibration resonance frequency of sensor element 2 can be reduced, and fluctuation of the detection sensitivity can be efficiently suppressed.

As described above, according to the present invention, in the angular velocity sensor in which a sensor element is mounted on the ASIC or the ceramic substrate via a lower lid, when the elastic modulus of adhesive with which the sensor element and the ASIC or the ceramic substrate adhere to each other is made to be smaller than the elastic modulus of the adhesive with which the sensor element and the lower lid adhere to each other, transmittance of a stress applied to the angular velocity sensor to the sensor element can be efficiently suppressed. As a result, since the fluctuation of the frequency difference between the drive vibration resonance frequency and the detection vibration resonance frequency of the sensor element can be suppressed, the fluctuation of the detection sensitivity of an inertial force sensor such as an angular velocity sensor can be efficiently suppressed.

In the above-mentioned exemplary embodiment, an angular velocity sensor is described as an example of the inertial force sensor, but the present invention can be applied to the other sensor elements, for example, an acceleration velocity sensor, which uses a vibrator.

Furthermore, the above-mentioned exemplary embodiment describes an example in which silicon resin is used as the first adhesives, and epoxy resin is used as second and third adhesives, but the other combination of adhesives may be used as long as the relation with respect to the elastic modulus is the same.

Other Exemplary Embodiment

Figure 13:
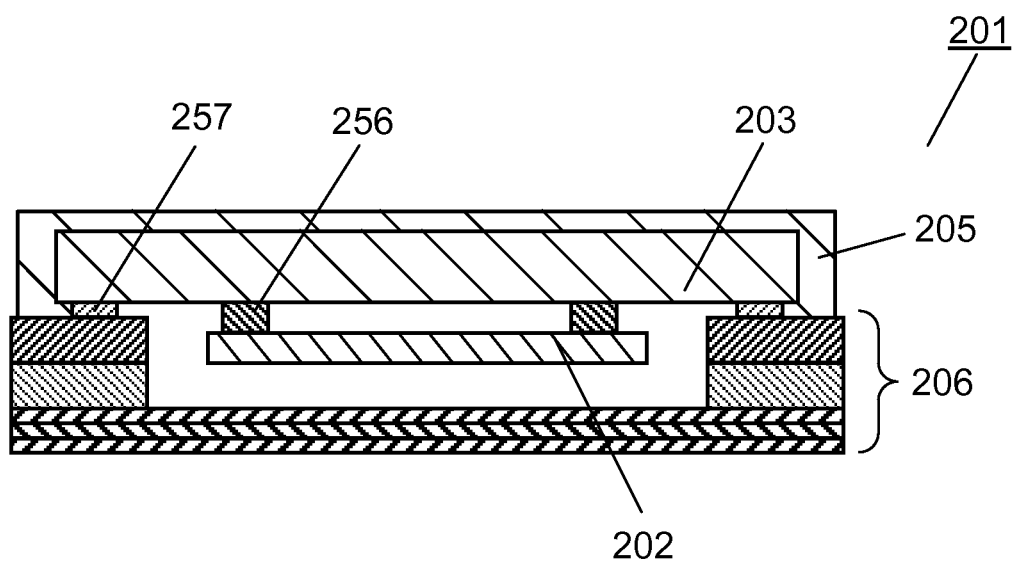
FIG. 13 is a sectional view of an angular velocity sensor in accordance with another exemplary embodiment of the present invention.

FIG. 13 is a sectional view of angular velocity sensor in accordance with another exemplary embodiment of the present invention.

As shown in FIG. 13, angular velocity sensor 201 includes sensor element 202, ASIC 203, sealing resin 205, and ceramic substrate 206. Sensor element 202 is connected to a surface of ASIC 203 on which a circuit is formed by flip chip. ASIC 203 is connected to ceramic substrate 206 by flip chip. Sealing resin 205, together with ceramic substrate 206, covers sensor element 202 and ASIC 203. Hereinafter structures, connection positions, and connection states thereof are described in detail.

Figure 14:
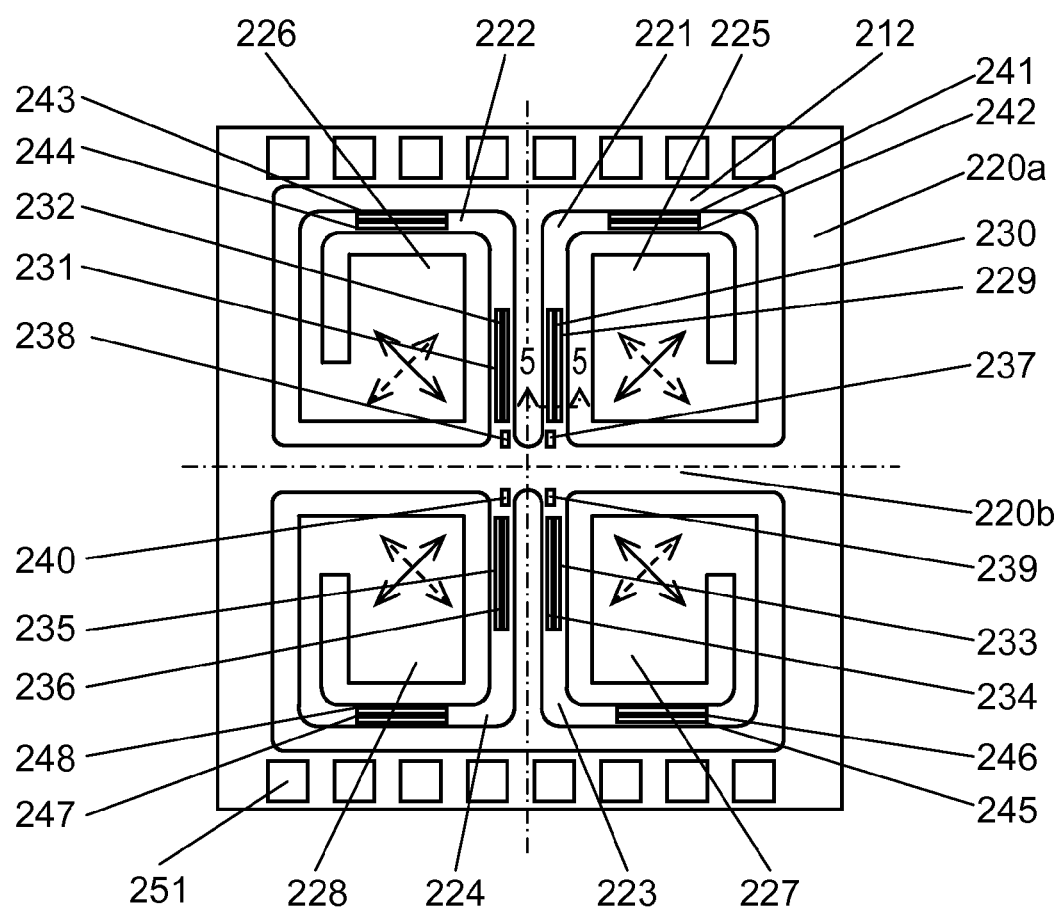
FIG. 14 is a plan view of a sensor element in accordance with the other exemplary embodiment of the present invention.
Figure 14:
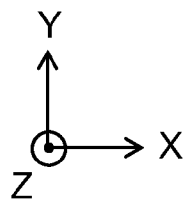

FIG. 14 is a plan view of sensor element 202. Sensor element 202 has quadrangular outer frame part 220a provided with hollow region 212. Sensor element 202 has center beam part 220b linking facing sides of outer frame part 220a in such a manner as crossing over the center portion of hollow region 212. Sensor element 202 has four weights 225 to 228. Four weights 225 to 228 are connected to the vicinity of the center of center beam part 220b by first to fourth arms 221 to 224. Outer frame part 220a, center beam part 220b, weights 225 to 228, and first to fourth arms 221 to 224 are formed unitarily with each other by the same members. Each of first to fourth arms 221 to 224 bends in at least two portions and is connected to each of weights 225 to 228. Thus, weights 225 to 228 tend to move by the inertial force, and the sensitivity is improved.

As shown in FIG. 14, sensor element 202 includes drive parts 229 to 236, detector parts 241 to 248, and monitor parts 237 to 240 in each of first to fourth arms 221 to 224.

As shown in FIG. 14, sensor element 202 has connection electrodes 251 in two facing sides of outer frame part 220a, and connection electrodes 251 are connected to drive parts 229 to 236 or detector parts 241 to 248 by wiring (not shown). Two sides forming connection electrode 251 are formed into the sides parallel to center beam part 220b. Thus, two sides on which connection electrode 251 is not formed can be made to be thinner than two sides provided with connection electrode 251, they bend as beams and can absorb shock from the outside.

Sensor element 202 shown in FIG. 14 is sensor element 2 shown in FIG. 4 from which fixing parts 17a and 17b, outer beam parts 18a and 18b, and connection parts 19a and 19b are excluded. Drive parts 229 to 236 and detector parts 241 to 248 of sensor element 202 have the same functions as those of drive parts 29 to 36 and detector parts 41 to 48 of sensor element 2.

With this configuration, a sensor element can be further miniaturized, and, in turn, an entire part of the angular velocity sensor can be further miniaturized. Sensor element 202 has substantially a square shape.

Figure 15:
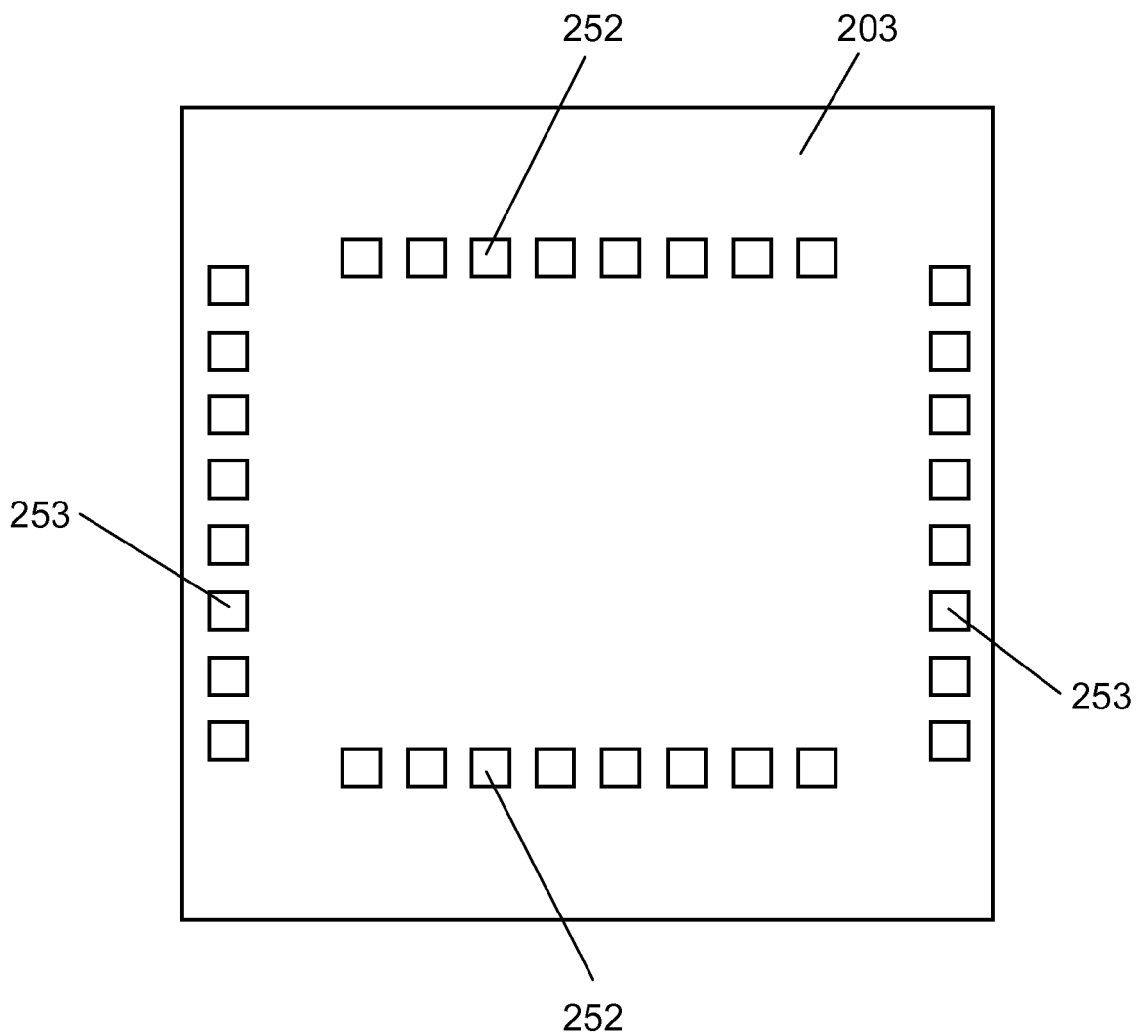
FIG. 15 is a plan view of a circuit formation plane of ASIC in accordance with the other exemplary embodiment of the present invention.

FIG. 15 is a plan view of a circuit formation plane of ASIC 203. As shown in FIG. 15, the circuit formation plane of ASIC 203 is provided with inner electrodes 252 and outer electrodes 253.

As shown in FIG. 15, inner electrodes 252 are formed along facing two sides of ASIC 203. Inner electrodes 252 are connected to connection electrodes 251 of sensor element 202.

As shown in FIG. 15, outer electrodes 253 are formed along facing two sides of ASIC 203. Outer electrodes 252 are connected to connection electrodes 251 of sensor element 202. Outer electrodes 253 are connected to ceramic substrate 206. In FIG. 15, outer electrodes 253 are formed along the two facing sides that are different from the sides provided with inner electrodes 252. With this configuration, the degree of freedom of disposing of inner electrode 252 and outer electrode 253 is improved.

Note here that an electrode of ASIC 203 connected to sensor element 202 is referred to as inner electrode 252, and ASIC 203 connected to ceramic substrate 206 is referred to as outer electrode 253, but it is not necessary that inner electrode 252 is provided to the center than outer electrode 253.

Furthermore, ASIC 203 has a rectangular shape in which a longer side is longer by 10-20% than the shorter side.

ASIC 203 is formed by bonding re-wiring layers to a semiconductor chip. That is to say, inner electrodes 252 and outer electrodes 253 are laid out by re-wiring layers from a terminal of the semiconductor chip, and are disposed as shown in FIG. 15. Each re-wiring layer has a laminated structure of the insulating layer and the wiring layer with a shielding layer, which are widely provided with a conductor, interposed therebetween, so that an effect of coupling on ASIC 203 from the outside can be reduced. The shielding layer is in a ground electric potential or floating in which it is not connected to the semiconductor chip or sensor element 202.

Figure 16A:
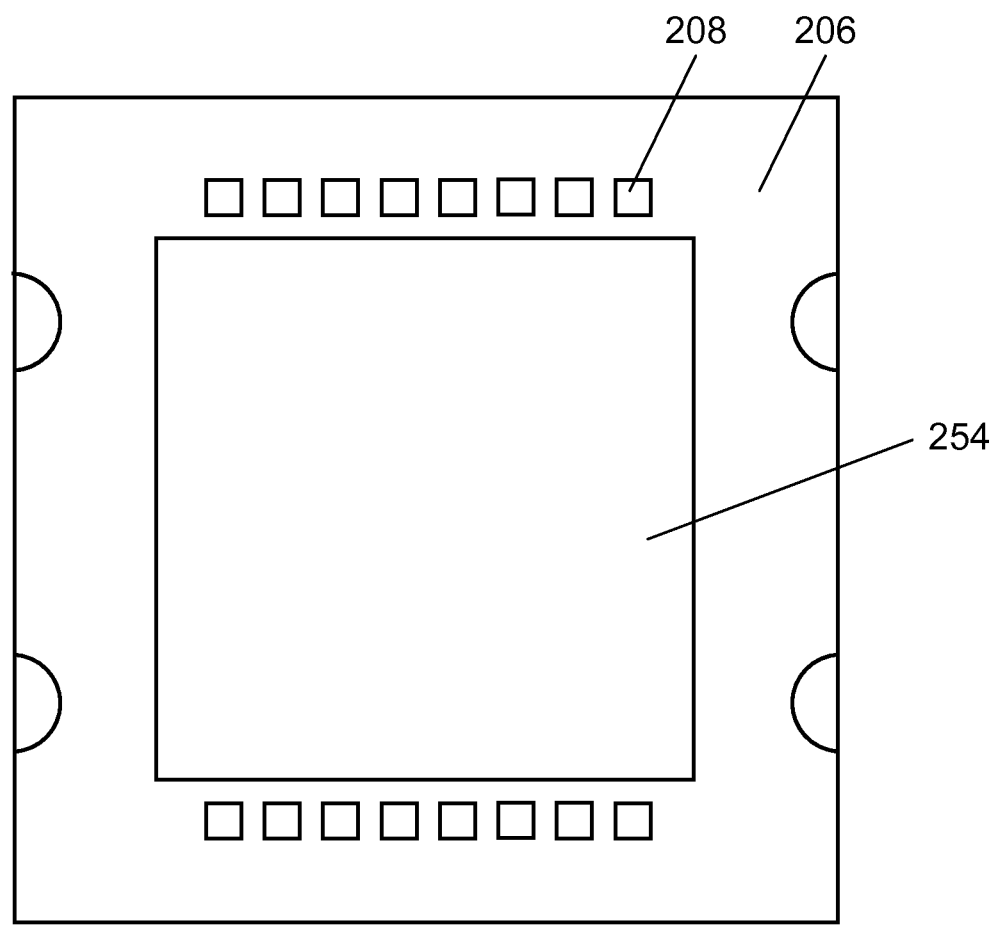
FIG. 16A is a top view of a ceramic substrate in accordance with the other exemplary embodiment of the present invention.
Figure 16B:
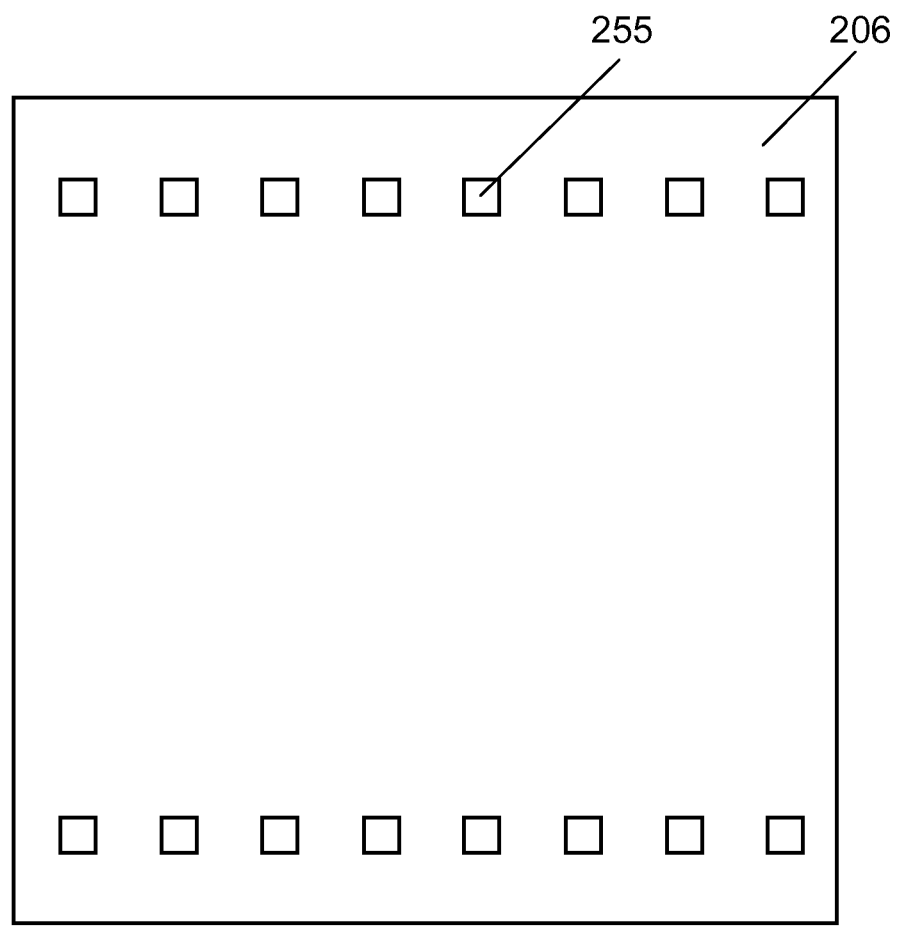
FIG. 16B is a bottom view of the ceramic substrate in accordance with the other exemplary embodiment of the present invention.

FIG. 16A is a top view of ceramic substrate 206, and FIG. 16B is a bottom view of ceramic substrate 206.

As shown in FIG. 16A, ceramic substrate 206 includes space portion 254 for accommodating sensor element 202, and electrode pad 208 formed in the peripheral portion. The depth of space portion 254 is about 250 to 260 μm. As the depth is smaller, the thickness of the inertial force sensor can be reduced and a stress can be relieved. That is to say, the height at the center portion is lower than the height at the peripheral portion in ceramic substrate 206, and, thus, space portion 254 is formed. Electrode pad 208 is formed along two facing sides of ceramic substrate 206. Electrode pads 208 are connected to outer electrodes 253 of ASIC 203, and when outer electrodes 253 are formed on four sides, electrode pads 208 are also formed on the four sides.

As shown in FIG. 16B, ceramic substrate 206 has connection terminals 255 to be connected to the outside on the lower surface thereof. Connection terminals 255 are connected to electrode pads 208 by wiring (not shown) that passes through the inside of ceramic substrate 206.

Next, positional relation and connection of each of sensor element 202, ASIC 203, sealing resin 205, and ceramic substrate 206 in exemplary embodiment are described with reference to FIG. 13.

Sensor element 202 is connected to a circuit formation plane (first surface) side of ASIC 203. More specifically, connection electrode 251 of sensor element 202 and inner electrode 252 of ASIC 203 are flip-chip connected (second flip-chip bonding) by copper post 256 via a gold bump (not shown). The height of the gold bump is about 20 μm, and the height of copper post 256 is about 24 μm to 40 μm. As a result, distance between sensor element 202 and ASIC 203 becomes 44 μm to 60 μm. In order to obtain advantages with respect to the stress, it is preferable that sensor element 202 and ASIC 203 are apart from each other by not less than 36 μm. In this way, when flip-chip bonding is carried out, speed at which signals are exchanged between sensor element 202 and ASIC 203 can be increased.

Note here that connection between sensor element 202 and ASIC 203 are carried out via a gold bump, but connection is carried out by mainly copper post. Therefore, the elastic force is increased. Furthermore, other than this gold bump, conductive paste such as silver paste and solder can be used.

The thickness of sensor element 202 is 90 μm to 125 μm. It is preferable that sensor element 202 is apart from the bottom surface of space portion 254 of ceramic substrate 206 by 100 μm. When they are disposed closer, physical interference or electrical interference may occur due to vibration.

ASIC 203 is connected to ceramic substrate 206 in such a manner that a circuit formation plane side of ASIC 203 faces ceramic substrate 206 in order that sensor element 202 is accommodated in space portion 254 of ceramic substrate 206. More specifically, outer electrodes 253 of ASIC 203 and connection terminals 255 of sensor element 202 are flip-chip connected (first flip-chip bonding) by gold bump 257. The height of gold bump 257 is about 20 μm. In this way, when flip-chip bonding is carried out, speed at which signals are exchanged between ASIC 203 and the outside via ceramic substrate 206 can be increased.

Since connection between ASIC 203 and ceramic substrate 206 is carried out via only a gold bump, the elastic force becomes smaller than that of copper post 256.

Note here that connection between ASIC 203 and ceramic substrate 206 can be carried out with material having relatively low elasticity, for example, conductive paste such as silver paste other than a gold bump. Thus, even when a substrate deforming stress or a thermal stress is applied to angular velocity sensor 201, it is possible to efficiently suppress transmission of such stresses to sensor element 202. Therefore, the fluctuation of the frequency difference between the drive vibration resonance frequency and the detection vibration resonance frequency can be sufficiently suppressed, thus enabling the fluctuation of the detection sensitivity of the angular velocity to be suppressed.

The thickness of ASIC 203 is 150 μm to 270 μm, the thickness of sealing resin 205 that is positioned higher than ASIC 203 is 80 μm to 130 μm, and the thickness of sealing resin 205 is smaller than that of ASIC 203. The thinner ASIC 203 is, the greater the effectiveness with respect to stress relaxation is. That is to say, as both ASIC 203 and sealing resin 205 are thinner, the effectiveness with respect to stress relaxation is increased.

Sealing resin 205 is formed on ceramic substrate 206 so as to cover ASIC 203. At this time, it is preferable that sealing resin 205 has viscosity such that it enters into space portion 254 of ceramic substrate 206. That is to say, material and pressurizing are selected by considering space between ASIC 203 and ceramic substrate 206. Furthermore, as material of the sealing resin, material having lower elasticity than that of a gold bump is preferable. Thus, the gold bump is predominant in the rigidity of connection between ASIC 203 and ceramic substrate 206.

As sealing resin 205, one obtained by laminating a plurality of resin films can be used. At this time, it is preferable that a film at an ASIC 203 side is resin having higher viscosity than that of a film at opposite side to ASIC 203 such that resin does not easily flow into space portion 254 of ceramic substrate 206. Furthermore, it is preferable that the film at the ASIC side is a film having smaller filler size than that of the film disposed opposite side to ASIC 203.

Ceramic substrate 206 has a wiring structure inside thereof, electrode pad 208 of FIG. 16A to connection terminal 255 of FIG. 16B are connected to each other by wiring. In FIG. 16B, connection terminals 255 are disposed at two facing sides of ceramic substrate 206, but connection terminals 255 may be disposed at four sides, so that space of connection terminal 255 can be increased.

Furthermore, the thickness of a portion positioned below space portion 254 of ceramic substrate 206 is 100 μm to 150 μm. When the thickness is larger, the film can bend such that a stress is relieved.

As mentioned above, a sensor element, ASIC, a ceramic substrate, sealing resin, a cap, and the like, are described, but they can be combined in a scope in which they are not contradictory to each other. For example, in FIG. 13, instead of sealing resin, cap can be used. Furthermore, sensor element 2 of FIG. 4 can be used instead of sensor element 202 in a structure shown in FIG. 13. Furthermore, on the contrary, sensor element 202 shown in FIG. 14 can be used instead of sensor element 2 in a structure shown in FIG. 1. The same is true to ASIC 3 and ASIC 203.

INDUSTRIAL APPLICABILITY

The present invention can be widely applied for inertial force sensors mounted on portable devices such as portable telephones, digital cameras, portable game machines, and PDA, and on a vehicle.

REFERENCE MARKS IN THE DRAWINGS 1, 1a, 1b, 201 angular velocity sensor
2, 202 sensor element
3, 203 ASIC (circuit chip)
4 lower lid
4a, 4b, 4c, 4d, 4e, 4f support part
5 cap
6, 206 ceramic substrate
7, 8, 208 electrode pad
9 bonding wire
10a, 10b second adhesive
11a, 11b first adhesives
12, 212 hollow region
13 third adhesive
14 inner edge
17a, 17b fixing part
18a, 18b outer beam part
19a, 19b connection part
20a inner beam part 20b, 220b center beam part
21-24 arm
25-28, 225-228 weight
29-36, 229-236 drive part
29a, 30a lower electrode
29b, 30b piezo element
29c, 30c upper electrode
37-40, 237-240 monitor part
41-48, 241-248 detector part
50 bonding part
62 wiring layer
80a, 80b first slit (through-hole)
100 bench
101 screw
102 base
103 arrow
104 spacer
252 inner electrode (second electrode)
253 outer electrode (first electrode)
254 space portion
255 connection terminal
256 copper post (second connection member)
257 gold bump (first connection member)

The invention claimed is:

1. An angular velocity sensor comprising:
a first substrate having a lower surface on which an output terminal is provided and an upper surface on which an electrode is provided;
a second substrate disposed on the first substrate, having a circuit carrying out at least one of a signal process selected from a synchronous detection process, a filter process or a correction process, outputting a signal to the output terminal;
a third substrate disposed on the second substrate;
a fourth substrate disposed on the third substrate, having a frame part, a beam part connected to the frame part, a weight part connected to the beam part, an electrode pad disposed on the frame part, and a drive part to cause a vibration in the weight part, the electrode pad electrically connected to the circuit;
a bonding wire electrically connecting the electrode pad to the electrode on the upper surface of the first substrate;
a first connection layer disposed between the second substrate and the third substrate, and connecting the second substrate and the third substrate, comprising a silicon material; and
a second connection layer disposed between the third substrate and the fourth substrate, and connecting the third substrate and the fourth substrate;
wherein the first substrate, the second substrate, the third substrate, and the fourth substrate are stacked in this order, and
wherein an elastic modulus of the first connection layer is smaller than an elastic modulus of the second connection layer.

2. The angular velocity sensor of claim 1, wherein the electrode pad is disposed on an upper surface of the fourth substrate.

3. The angular velocity sensor of claim 1,
wherein the weight part includes a first weight part, a second weight part, a third weight part and a fourth weight part, and
wherein the third substrate is provided with through-holes at positions corresponding to the first weight part, the second weight part, the third weight part and the fourth weight part.

4. The angular velocity sensor of claim 1, wherein the second connection layer is not provided between the weight part and the third substrate, and the third substrate is recessed relative to the weight part at a portion where the second connection layer is not provided.

5. The angular velocity sensor of claim 1, wherein
the weight part includes a first weight part, a second weight part, a third weight part and a fourth weight part;
the beam part includes a first beam part, a second beam part, a third beam part and a fourth beam part connected to respective one of the first weight part, the second weight part, the third weight part and the fourth weight part;
the fourth substrate includes a center beam part connected to the first beam part, the second beam part, the third beam part and the fourth beam part, and
a third layer is disposed between the center beam part and the third substrate.

6. The angular velocity sensor of claim 5, wherein the third layer is disposed below a center of the fourth substrate.

7. The angular velocity sensor of claim 1, wherein the electrode pad is disposed at an outer peripheral part of the fourth substrate.

8. The angular velocity sensor of claim 7, wherein the second connection layer is disposed under the outer peripheral part of the fourth substrate.

9. The angular velocity sensor of claim 1, wherein the first substrate includes a cavity to accommodate the second substrate, the third substrate and the fourth substrate.

10. The angular velocity sensor of claim 1, wherein the first substrate comprises a ceramic material.

11. The angular velocity sensor of claim 1, wherein each of the third substrate and the fourth substrate comprise a silicon material.

12. The angular velocity sensor of claim 1, wherein the fourth substrate includes a detector part to detect a Coriolis force caused by an angular velocity applied to the angular velocity sensor.

* * * * *